United States Patent
Mirabel et al.

(10) Patent No.: US 7,242,621 B2
(45) Date of Patent: Jul. 10, 2007

(54) FLOATING-GATE MOS TRANSISTOR WITH DOUBLE CONTROL GATE

(75) Inventors: Jean-Michel Mirabel, Cabries (FR);
Arnaud Regnier, Le Tholonet (FR);
Rachid Bouchakour, Marseille (FR);
Romain Laffont, Marseille (FR);
Pascal Masson, Marseille (FR)

(73) Assignees: STMicroelectronics Rousset SAS, Rousset (FR); Universite d'Aix Marseille I, Marseille Cedex (FR)

( * ) Notice: Subject to any disclaimer, the term of this patent is extended or adjusted under 35 U.S.C. 154(b) by 29 days.

(21) Appl. No.: 11/155,306

(22) Filed: Jun. 17, 2005

(65) Prior Publication Data
US 2005/0286303 A1 Dec. 29, 2005

(30) Foreign Application Priority Data
Jun. 18, 2004 (FR) .................................. 04 06684

(51) Int. Cl.
*G11C 16/04* (2006.01)
(52) U.S. Cl. .......................... 365/185.29; 365/185.26; 365/185.28
(58) Field of Classification Search ........... 365/185.29, 365/185.28, 185.26
See application file for complete search history.

(56) References Cited

U.S. PATENT DOCUMENTS

| | | | |
|---|---|---|---|
| 3,825,946 A | 7/1974 | Frohman-Bentchkowsky | 357/23 |
| 4,357,685 A | 11/1982 | Daniele et al. | 365/189 |
| 5,008,212 A * | 4/1991 | Chen | 257/E21.209 |
| 6,144,586 A | 11/2000 | Van Houdt et al. | 365/185.29 |
| 6,414,876 B1 | 7/2002 | Harari et al. | 365/185.22 |
| 6,504,762 B1 | 1/2003 | Harari | 365/185.24 |
| 6,822,900 B2 * | 11/2004 | Kamei | 365/185.11 |
| 2004/0065917 A1 | 4/2004 | Fan et al. | 257/315 |

FOREIGN PATENT DOCUMENTS

JP  6-97456  4/1994

OTHER PUBLICATIONS

Torelli, G. "An LSI Technology Fully Compatible EAROM Cell," *Alta Frequenza*, LI:6:345-351, 1982.
Torelli, G. "An Improved Method for Programming a Word-Erasable EEPROM," *Alta Frequenza*, LII:6:487-494, 1983.

* cited by examiner

*Primary Examiner*—Thong Q. Le
(74) *Attorney, Agent, or Firm*—Lisa K. Jorgenson; Eric M. Ringer; Seed IP Law Group PLCC

(57) ABSTRACT

The present invention relates to a floating-gate MOS transistor, comprising drain and source regions implanted into a silicon substrate, a channel extending between the drain and source regions, a tunnel oxide, a floating gate, a gate oxide and a control gate extending according to a determined gate length. According to the present invention, the control gate comprises a small gate and a large gate arranged side by side and separated by an electrically insulating material. Application to the production of memory cells without access transistor, and to the implementation of an erase-program method with reduced electrical stress for the tunnel oxide.

13 Claims, 2 Drawing Sheets

Figure 3:
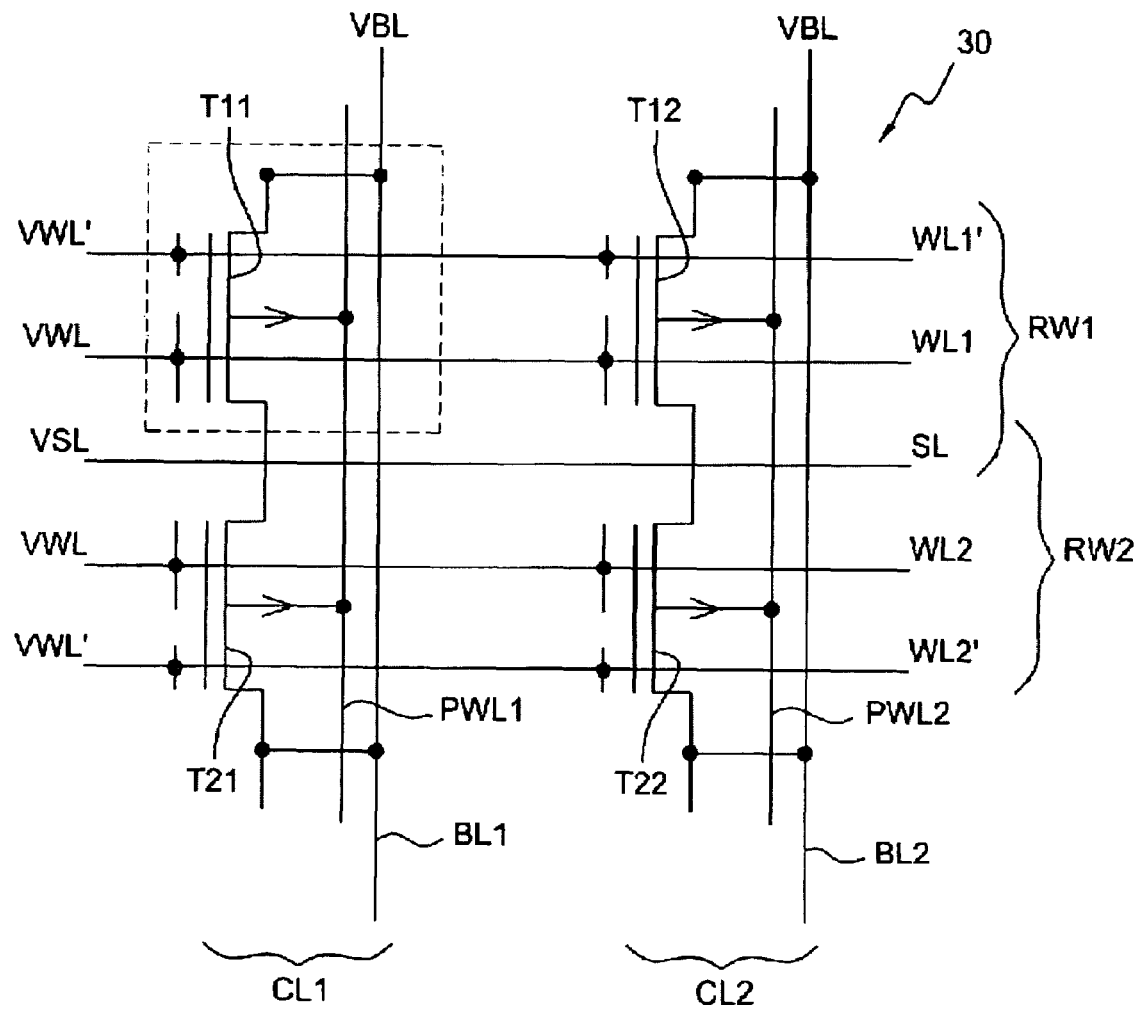

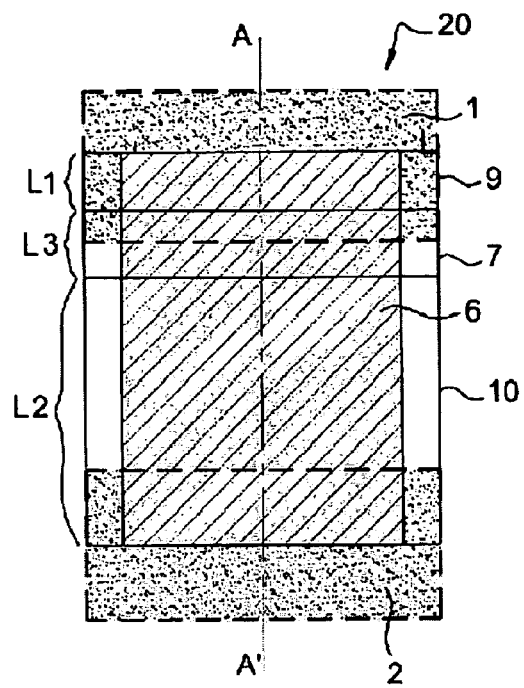
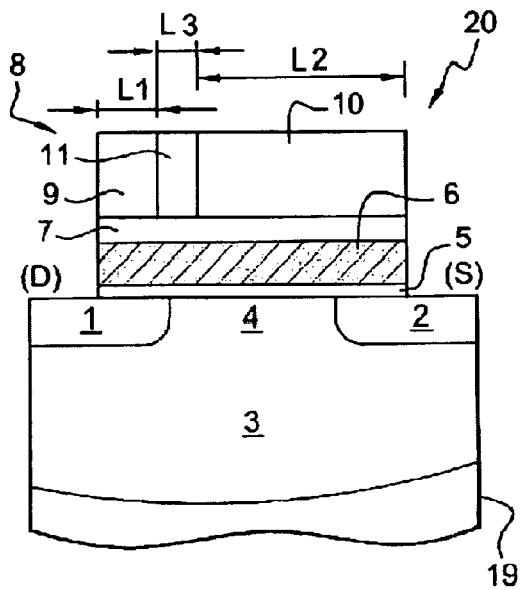
Fig. 1B
Fig. 1A
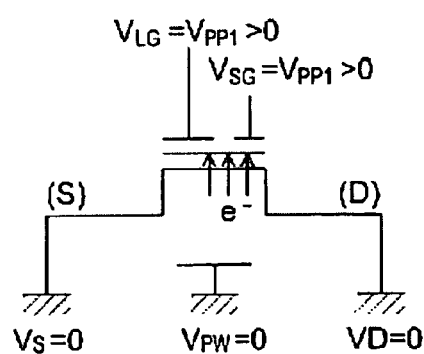
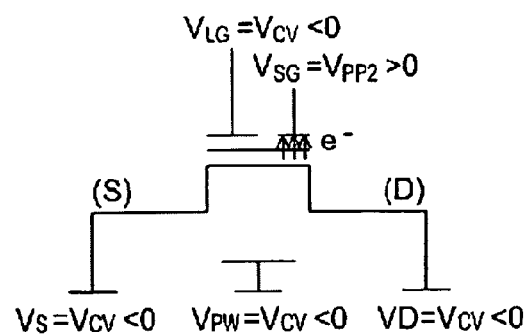
Fig. 2A
Fig. 2B

FLOATING-GATE MOS TRANSISTOR WITH DOUBLE CONTROL GATE

BACKGROUND OF THE INVENTION

1. Field of the Invention

The present invention relates to a floating-gate MOS transistor for producing an EEPROM-type electrically erasable and programmable memory cell.

2. Description of the Related Art

EEPROM memory cells are classically produced by means of floating-gate transistors comprising drain and source regions implanted into a silicon substrate, a channel extending between the drain and source regions, a tunnel oxide, a floating gate, a gate oxide and a control gate having a determined gate length.

In a classical EEPROM memory array architecture, the drain of the floating-gate transistor of the memory cell is generally linked to a bit line through an access transistor that is driven by a word line, whereas the control gate of the floating-gate transistor is generally linked to a gate control line through a gate control transistor.

One disadvantage of classical EEPROM memory cells and the corresponding architectures of EEPROM memory arrays thus lies in the presence of the access transistor. This transistor is difficult to miniaturize and limits the endurance of the memory cells, the malfunctioning the most frequently encountered being due to access transistor breakdowns.

BRIEF SUMMARY OF THE INVENTION

Thus, the present invention aims to provide a new type of floating-gate MOS transistor enabling in particular but not exclusively EEPROM memory cells to be produced without any access transistor.

The present invention also aims to provide an EEPROM memory array structure produced by means of such a floating-gate transistor.

Flash memory cells are known as an alternative to EEPROM memory cells, the former being devoid of any access transistor and enabling high density memories, in terms of occupied silicon surface, to be produced. However, Flash memory cells themselves have various disadvantages. Thus, the floating-gate transistors are programmed by injection of hot electrons and this involves a considerable programming current (drain-source current) compared to programming by tunnel effect (Fowler-Nordheim effect) used in EEPROM memory cells. This programming current limits the number of memory cells that can be programmed simultaneously and weakens the source lines and the source line contacts. Furthermore, the floating-gate transistors of Flash memories undergo a considerable electrical stress during the phases of programming transistors located on the same bit line, which causes losses of electric charges or involuntary injections of electric charges, which in turn lead to drifts of their threshold voltage. These drifts require providing methods for controlling and refreshing the transistors, so as to maintain their threshold voltage within determined value brackets and to avoid read errors.

A classical EEPROM memory floating-gate transistor also undergoes an electrical stress during the extraction of electric charges trapped in its floating gate (programming of the memory cell), performed through the tunnel oxide. Indeed, a high voltage is applied to the drain and backward biases the drain-substrate junction. In these conditions, the cell is subjected to a band-to-band tunneling current which increases the current consumed by the cell and creates an injection of hot holes into the tunnel oxide, thus reducing the reliability of the cell and leading to tunnel oxide breakdown phenomena.

Thus, the present invention also aims, but not exclusively, to provide a new type of floating-gate MOS transistor enabling a method for erasing and programming the transistor to be implemented which limits the electrical stress undergone by the tunnel oxide.

This object is achieved by providing a floating-gate MOS transistor, comprising drain and source regions implanted into a silicon substrate, a channel extending between the drain and source regions, a tunnel oxide, a floating gate, a gate oxide and a control gate having a determined gate length, wherein the control gate comprises a small gate and a large gate arranged side by side and separated by an electrically insulating material.

According to one embodiment, the drain and source regions are N-doped regions and the substrate is a P-type well.

According to one embodiment, the length of the large gate is in the order of 3 to 6 times the length of the small gate.

According to one embodiment, the distance between the small gate and the large gate is in the order of 0.7 to 1.5 times the length of the small gate.

According to one embodiment, the small and large gates are formed by an etched polysilicon layer and are separated by an oxide spacer.

The present invention also relates to a method for erasing and programming a floating-gate transistor according to the present invention, comprising the application of electric potentials to the small and large gates, to the drain and source regions, and to the substrate, to respectively inject electric charges into the floating gate and extract electric charges from the floating gate, and wherein the electric potentials are chosen such that the injection of electric charges into the floating gate is performed through the tunnel oxide and the extraction of electric charges trapped in the floating gate is performed through the gate oxide, so that the electrical erase-program stress is equitably borne by the tunnel oxide and the gate oxide.

According to one embodiment, the erasing of the transistor comprises the application of a positive electric potential to the small and large gates, and the application to the drain region and to the substrate of an electric potential lower than the potential of the small and large gates, such that electric charges are injected into the floating gate via the tunnel oxide.

According to one embodiment, the programming of the transistor comprises the application of a negative electric potential to the large gate, to pull down the electric potential of the floating gate, the application of a positive electric potential to the small gate, and the application of a negative electric potential to the drain region and to the substrate, such that electric charges are extracted from the floating gate via the gate oxide.

The present invention also relates to an EEPROM memory array structure comprising memory cells comprising floating-gate transistors arranged in lines and columns, wherein the memory cells comprise a floating-gate transistor according to the present invention.

According to one embodiment, the drains of the floating-gate transistors are linked to bit lines without going through an access transistor.

According to one embodiment, the memory array comprises rows and columns of floating-gate transistors, and the floating-gate transistors of a same row have their large gate linked to a first common word line and their small gate linked to a second common word line.

BRIEF DESCRIPTION OF THE SEVERAL VIEWS OF THE DRAWING(S)

These and other objects, features and advantages of the present invention will be explained in greater detail in the following description of a floating-gate transistor according to the present invention, of a method for erasing and programming the transistor according to the present invention and of a memory array structure produced by means of transistors according to the present invention, given in relation with but not limited to the following figures:

FIGS. 1A, 1B respectively represent by a cross-section and a top view the structure of a floating-gate transistor according to the present invention, FIGS. 2A, 2B respectively show a method for erasing and a method for programming the transistor according to the present invention, and FIG. 3 represents an example of an EEPROM memory array comprising floating-gate transistors according to the present invention.

DETAILED DESCRIPTION OF THE INVENTION

Example of a Floating-gate Transistor Structure According to the Present Invention FIGS. 1A, 1B schematically represent an example of a floating-gate MOS transistor 20 structure according to the present invention, implanted onto a silicon chip 19. In FIG. 1A, the transistor 20 is represented in a cross-section according to a drain-source axis AA' appearing in FIG. 1B. In FIG. 1B, the transistor 20 is represented by a top view, certain elements of the transistor being represented by transparency, others not being represented for the sake of legibility of the Figure.

The transistor 20 classically comprises drain 1 and source 2 regions implanted into a silicon substrate 3, between which a channel region 4 extends. The regions 1, 2 are for example of N+ type and the substrate 3 is for example a P-type well implanted into the silicon chip 19. Above the channel region 4, and going from bottom to top, the transistor 20 comprises a layer of tunnel oxide 5, a floating gate 6, a layer of gate oxide 7, and a control gate 8 according to the present invention. The drain, source, small and large gate, and substrate contacts are not represented for the sake of legibility of the Figures and are produced classically.

According to the present invention, the control gate 8 comprises a small gate 9 and a large gate 10, juxtaposed and separated by an insulating material, such as an oxide spacer 11 for example.

In one embodiment, the small gate 9 is positioned to be exclusively over the drain region 1 (or the source region 2) and does not overlap the channel region 4. The insulating region 11 is positioned so as to be over the interface between the drain region 1 and the channel region 4. The large gate 10 extends partially over the source region 2 (or the drain region 1) and over a majority of the channel region 4. The large gate 10 terminates over the channel region 4 so that a portion of the channel region 4 is not overlaid by the large gate 10, see for example FIG. 1A.

In an alternative embodiment, the small gate 9 partially overlaps the channel region 4 to partially overlay the interface between the channel region 4 and the drain region 1, and the insulator 11 is fully over channel region 4.

In one embodiment, the large gate 10 extends completely over the channel region 4 to partially overlay the drain region 1. The overall length of the gate 8 is equal to the sum of the length L1 of the small gate 9, of the length L2 of the large gate 10 and of the length L3 of the oxide spacer 11. Classically, this gate length is substantially greater than the "useful" length of the gate, i.e., the distance between the drain 1 and source 2 regions (length of the channel). Thus, the small gate 9, the oxides 5, 7 and the floating gate 6 extend partially above the drain region 1, whereas the large gate 10, the oxides 5, 7 and the floating gate 6 extend partially above the source region 2.

In an example of an embodiment, the floating gate 6 is classically formed by etching a first layer of polysilicon (polycrystalline silicon) deposited on the substrate and generally designated "poly1", whereas the small gate 9 and the large gate 10 are formed by etching a second layer of polysilicon deposited on the substrate, generally designated "poly2". The gate oxide 7 or inter-polysilicon oxide can be a thick oxide or an ONO-type oxide (oxide/Nitride/oxide sandwich), the term "oxide" here designating any electrically insulating material (dielectric) or any multi-layer combination of electrically insulating materials generally speaking.

As a non limitative numerical example, the oxide 7 has a thickness in the order of 15 nm (nanometers), the tunnel oxide 5 has a thickness of 8 nm, the layers of polysilicon have respective thicknesses of 0.1 micrometer (floating gate, "poly1") and 0.2 micrometer (small and large gate, "poly2"). The oxide spacer is produced by overlapping the insulants covering the edges of the small gate and of the large gate (side insulations) and has a length L3 in the order of 0.2 to 0.3 micrometer. The small gate has a length L1 in the order of 0.2 to 0.3 micrometer. The large gate has a length L2 in the order of 1 to 1.1 micrometer, i.e., approximately a ratio of 3 to 6 between the length of the large gate and that of the small gate, and a ratio of 0.7 to 1.5 between the length of the small gate and that of the spacer. Of course, this is just one example. The actual sizes may be much smaller, and still maintain a selected ratio of gate length between large and small gates.

The floating-gate transistor 20 according to the present invention has two main advantages which lie firstly in that an erase/program method reducing the electrical stress undergone by the tunnel oxide can be applied to it, and secondly in that it offers the possibility of producing an EEPROM memory array consisting of memory cells devoid of any access transistor. These two aspects of the present invention will now be described in greater detail.

Erasing, Programming and Reading the Transistor

Here, one principle of the present invention is to use different paths for injecting and extracting electric charges into the floating gate, so as to reduce the electrical stress undergone by the tunnel oxide. This method also makes it possible, in programming phase, not to backward bias the drain-substrate or source-substrate junctions to remove the band-to-band tunneling phenomena that damage the tunnel oxide.

Erasing

In erasing phase, the injection of electric charges into the floating gate is performed by classically going through the tunnel oxide. The erase method is shown by FIG. 2A and examples of values of the voltages applied are described by table 1A below. The voltage applied to the large gate of the transistor is designated VLG, the voltage applied to the small gate is designated VSG, the voltages applied to the drain and to the source of the transistor are respectively designated VD and VS, and the substrate voltage (electric potential of the P well) is designated VPW.

As can be seen in Table 1A, voltages VLG, VSG equal to a positive erase voltage VPP1, for example 14V, are applied to the large gate and the small gate. Simultaneously, zero voltages VD, VPW (potential of the ground) are applied to the drain and to the substrate. The source potential VS is left floating or is equal to VD. As represented in FIG. 2A, the electrical field appearing, on the one hand, between the small and large gates and, on the other hand, between the drain and the substrate, attracts electric charges, here negative charges, which find themselves trapped in the floating gate after passing through the tunnel oxide.

TABLE 1A

CONTROL VOLTAGES IN ERASING PHASE

| Voltages | Erase (injection) |
| --- | --- |
| VLG | VPP1 (14 V) |
| VSG | VPP1 (14 V) |
| VD (drain) | 0 |
| VPWL (VPW) | 0 |
| VS (source) | Floating or equal to VD |

In one alternate embodiment, the voltage VPP1 could be lower, such as 7V for example, and the voltages VD, VPWL be negative, such as −7V for example, it being most important to apply a sufficient potential difference to the transistor to erase it.

Programming

The program method according to the present invention is shown by FIG. 2B and examples of values of the voltages applied to the transistor are described by table 1B below. As in a conventional EEPROM memory, the programming is obtained by tunnel effect, and not by injection of hot carriers. However, the method according to the present invention differs from a classical program method in that the large gate VLG, drain VD and substrate VPW voltages are taken to a negative bias value VCV, such as −7V for example, whereas the voltage VSG of the small gate is taken to a considerably positive program value VPP2, such as 15V for example.

Due to the high capacitive coupling between the large gate and the floating gate, the negative potential of the large gate pulls the potential of the floating gate down. Thus, electric charges trapped in the floating gate are attracted by the positive potential VPP2 of the small gate and are extracted from the floating gate by going through the gate oxide.

The extraction of the electric charges trapped in the floating gate is thus performed by going through the gate oxide instead of by going through the tunnel oxide. As a result, the tunnel oxide is protected from the program stress and only undergoes the erase stress. In other terms, the electrical erase/program stress is "equitably" distributed between the two layers of oxide, and the resistance of the transistor to ageing is thereby improved.

TABLE 1B

CONTROL VOLTAGES IN PROGRAMMING PHASE

| Voltages | Programming (extraction) |
| --- | --- |
| VLG | VCV (−7 V) |
| VSG | VPP2 (15 V) |
| VD (drain) | VCV (−7 V) |
| VPWL (VPW) | VCV (−7 V) |
| VS (source) | floating or equal to VD |

In one alternative embodiment, the various electric erase and program potentials could be chosen so as to reverse the directions of injecting and extracting the negative electric charges, the electric charges being injected via the gate oxide and extracted via the tunnel oxide. In this case, reference would be made to an injection of positive charges (injection of holes) via the tunnel oxide and an extraction of positive electric charges via the gate oxide.

Reading

The reading of the floating-gate transistor, described by table 1C below, is obtained by applying a read voltage VREAD in the order of 5 V to the large gate as if the latter formed a single control gate of the transistor. The small gate can be left at a floating potential or be grounded. However, it could also receive the voltage VREAD. A drain-source voltage VDS=VD−VS in the order of 1V is applied to the transistor. If the transistor is in the erased state, its threshold voltage is higher than VREAD and the transistor remains off, the drain-source current being zero or very low. If the transistor is in the programmed state, its threshold voltage is below VREAD and the transistor is passed through by a significant drain-source current. This current is detected classically by a sense amplifier (not represented) the output of which changes to 1 or to 0, according to the read convention chosen, when the drain-source current is above a determined threshold representative of the programmed state of the transistor.

TABLE 1C

CONTROL VOLTAGES IN READING PHASE

| Voltages | Reading |
| --- | --- |
| VLG | VREAD |
| VSG | 0 or floating |
| VD (drain) | VD = VS + ~1 V so that VDS = ~1 V |
| VPWL (VPW) | 0 |
| VS (source) | VS |

Example of EEPROM Memory Array Architecture According to the Present Invention

As indicated above, the transistor according to the present invention makes it possible to produce an EEPROM memory array in which the memory cells are devoid of any access transistor. The memory cells can be erase, program and read selected by applying, to the small and the large gates, different pairs of voltages forming a sort of multiplexing of signals enabling memory cells to be individually selected. This selection can also be obtained by applying collective voltages to groups of transistors, as described below, by linking the memory cells to common word lines and bit lines. In this case, a transistor is individually selected by making sure that the transistors not to be selected receive combinations of gate, drain, substrate and source voltages that prevent the operation of erasing, programming or reading from having an effect on these transistors.

FIG. 3 represents a simplified example of memory array 30 according to the present invention, comprising only four memory cells each formed by a transistor according to the present invention, respectively T11, T12, T21, T22. The transistors are arranged in rows and columns, here two rows RW1, RW2 of two transistors each and two columns CL1, CL2 of two transistors each. The large gate of the transistors T11, T12 of the first row RW1 is connected to a first word line WL1 and the small gate of these transistors is connected to a second word line WL1'. The large gate of the transistors T21, T22 of the second row RW2 is connected to a first word line WL2 and the small gate of these transistors is connected to a second word line WL2'. The drain of the transistors T11, T21 of the first column CL1 is connected to a bit line BL1 and the substrate (here a P well) of these transistors is connected to a same substrate control line PWL1. The drain of the transistors T12, T22 of the second column CL2 is connected to a bit line BL2 and the substrate of these transistors is connected to a substrate control line PWL2. Finally, the sources of the two transistors of a same row are linked to a common source line SL. Furthermore, here, the sources of two transistors of two adjacent rows are connected to the same source line, such that the four transistors represented in FIG. 3 share the same source line SL.

Control of the Memory Cells

Table 2 below describes examples of voltages applied to the control lines of the memory array during the phases of programming, erasing and reading a transistor, i.e., here the word lines WL1, WL1', WL2, WL2', the bit lines BL1, BL2, the substrate control lines PWL1, PWL2 and the source line SL. These voltages are chosen so that the transistor that is erase, program or read selected receives the voltages described by tables 1A, 1B, 1C. It is considered here that a transistor is individually selected, such that a single transistor is erase, program or read selected.

In Table 2, the voltage applied to the word lines WL1, WL2 is designated VWL and corresponds to the voltage VGL applied to the large gate (Cf. tables 1A to 1C). The voltage applied to the word lines WL1', WL2' is designated VWL' and corresponds to the voltage VGS applied to the small gate (Cf. tables 1A to 1C). These two voltages have different values depending on whether the corresponding row RW1, RW2 is selected (SEL) or not (NOTSEL). Similarly, the voltage applied to the bit lines BL1, BL2 is designated VBL and corresponds to the drain voltage VD applied to the transistors (Cf. tables 1A to 1C). The voltage applied to the substrate control lines PWL1, WP2 is designated VPWL and corresponds to the substrate voltage VPW. These two voltages have different values depending on whether the corresponding column CL1, CL2 is selected (SEL) or not (NOTSEL). Finally, the voltage applied to the common source line is designated VSL and corresponds to the source voltage VS applied to the transistors.

TABLE 2

MEMORY ARRAY CONTROL VOLTAGE

| Voltages | State | Program | Erase | Read |
|---|---|---|---|---|
| VWL (VLG) | SEL | VCV (−7 V) | VPP1 (14 V) | VREAD |
| VWL (VLG) | NOTSEL | 0 | 0 | 0 |
| VWL' (VSG) | SEL | VPP2 (15 V) | VPP1 (14 V) | 0 or floating |
| VWL' (VSG) | NOTSEL | 0 | 0 | 0 |

TABLE 2-continued

MEMORY ARRAY CONTROL VOLTAGE

| Voltages | State | Program | Erase | Read |
|---|---|---|---|---|
| VBL (VD) | SEL | VCV (−7 V) | 0 | VD = VS + ~1 V |
| VBL (VD) | NOTSEL | 4 V | VPP1 (14 V) | 0 |
| VPWL (VPW) | SEL | VCV (−7 V) | 0 | 0 |
| VPWL (VPW) | NOTSEL | 4 V | VPP1 (14 V) | 0 |
| VSL (VS) | SEL/NOTSEL | floating or equal to VD | floating or equal to VD | VS |

It can be seen in Table 2 that a selected transistor receives a determined combination of control voltages whereas a non-selected transistor can receive two different combinations of voltages, depending on whether the non-selected transistor belongs to a selected row but to a non-selected column or to a selected column but to a non-selected row.

For a better understanding, table 3A below is extracted from table 2 and describes the voltages at the terminals of a selected transistor, i.e., a transistor located at the intersection of a selected row and a selected column. Table 3A corresponds to the sum of tables 1A, 1B, 1C, as required.

TABLE 3A

| Voltages | Program | Erase | Read |
|---|---|---|---|
| VLG (VWL) | VCV (−7 V) | VPP1 (14 V) | VREAD |
| VSG (VWL') | VPP2 (15 V) | VPP1 (14 V) | 0 or floating |
| VD (VBL) | VCV (−7 V) | 0 | VD = VS + ~1 V |
| VPW (Substrate) | VCV (−7 V) | 0 | 0 |
| VS (VSL) | floating or equal to VD | floating or equal to VD | VS |

Table 3B below describes the voltages applied to a non-selected transistor present on a selected row and a non-selected bit line.

Finally, table 3C below describes the voltages applied to a non-selected transistor present on a non-selected row and a selected column.

TABLE 3B

| Voltages | Program | Erase | Read |
|---|---|---|---|
| VLG (VWL) | VCV (−7 V) | VPP1 (14 V) | VREAD |
| VSG (VWL') | VPP2 (15 V) | VPP1 (14 V) | 0 or floating |
| VD (VBL) | 4 V | VPP1 (14 V) | 0 |
| VPW (Substrate) | 4 V | VPP1 (14 V) | 0 |
| VS (VSL) | floating or equal to VD | floating or equal to VD | VS |

TABLE 3C

| Voltages | Program | Erase | Read |
|---|---|---|---|
| VLG (VWL) | 0 | 0 | 0 |
| VSG (VWL') | 0 | 0 | 0 |
| VD (VBL) | VCV (−7 V) | 0 | VD = VS + ~1 V |
| VPW (Substrate) | VCV (−7 V) | 0 | 0 |
| VS (VSL) | floating or equal to VD | floating or equal to VD | VS |

In Table 3B, it can be seen that the small and large gate voltages of the non-selected transistor belonging to a selected row, are offset in programming phase by the voltages VS, VPW, here in the order of 4V, which neutralize the electric field at the floating gate, such that the latter does not receive or lose any electric charge. In erasing phase, the non-selected transistor receives identical voltages at its main terminals and is in a state of balance that does not interfere with the potential of the floating gate. Finally, in reading phase, the non-selected transistor receives the read voltage VREAD at its large gate but this voltage has no effect on the transistor since its drain terminal is grounded, such that it remains off.

In Table 3C, it can be seen that in programming phase the non-selected transistor belonging to a selected column receives a negative drain voltage via the bit line to which it is linked, and a negative substrate voltage. However, as the small and large gates are grounded, these voltages do not alter the potential of its floating gate. Similarly, in erasing phase, all of the voltages are zero and have no effect on the non-selected transistor. In reading phase, the transistor remains off since the small and large gate voltages are zero.

These various voltages, the exemplative values of which have been given as a guide, are supplied by line and column decoders not represented in FIG. 3 but the decoding function whereof is well known in itself. The bit lines are furthermore linked to program latches not represented but also known per se, and differing from latches of a classical EEPROM memory in that they supply a negative or positive voltage in programming phase, depending on whether a transistor present on the bit line must be programmed or not. Finally, it will be noted in Table 2 that the bit lines and the substrate control lines of a same column are taken to the same potential during the programming and erasing phases. Thus, switches interconnecting the substrate control lines and the bit lines of a same rank can be provided for this purpose.

It will be understood by those skilled in the art that various alternative embodiments of the present invention may be made, both as regards the structure of the transistor with small and large gates according to the present invention and as regards the architecture of a memory array produced with such a transistor and the combinations of voltages applied.

In particular, providing a double control gate according to the present invention can be applied to various other structures of floating-gate transistors known to those skilled in the art, in which the floating gate and the tunnel oxide are not necessarily formed along a vertical axis, as described above.

Finally, although the description above was of an erase/program method aiming to distribute the electrical stress over the tunnel oxide and the gate oxide, it goes without saying that a conventional erase/program method could be applied to the transistor according to the present invention, so as to always inject and extract electric charges through the layer of tunnel oxide. Similarly, although an example of an EEPROM memory array was described in which the memory cells are devoid of any access transistor, a transistor according to the present invention can also be used to produce a memory cell comprising such an access transistor. Thus, generally speaking, the transistor structure according to the present invention forms a first aspect of the present invention enabling the implementation of the second aspect of the present invention, relating to the program method with low electrical stress, and the implementation of the third aspect of the present invention relating to the removal of the access transistors from an EEPROM memory array, but the first aspect of the present invention is independent of the other two aspects of the present invention, which are also independent from one other.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for programming a floating-gate transistor, the method comprising:
    applying electric potentials to a small gate and a large gate of a control gate, wherein the small gate and the large gate are arranged side by side and separated by an electrically insulating material, and to a substrate having a drain region and a source region, to respectively inject electric charges into the floating gate and extract electric charges from the floating gate;
    choosing the electric potentials such that the injection of electric charges into the floating gate is performed through a tunnel oxide layer separating a floating gate from the substrate and such that the extraction of electric charges trapped in the floating gate is performed through a gate oxide layer separating the small gate of the control gate and the large gate of the control gate from the floating gate, so that stress caused by an electrical erase-program is equitably borne by the tunnel oxide layer and the gate oxide layer;
    applying a negative electric potential to the large gate, to pull down the electric potential of the floating gate;
    applying a positive electric potential to the small gate; and
    applying a negative electric potential to the drain region and to the substrate, wherein
    electric charges are extracted from the floating gate via the gate oxide.

2. The method according to claim 1 wherein during an erase the electric potential applied to the large gate is positive.

3. The method according to claim 2 wherein the electric potential applied to the small gate is the same as the electric potential applied to the large gate.

4. The method according to claim 1 wherein during a read the electric potential applied to the small gate is the floating potential.

5. The method according to claim 1 wherein during a read the electric potential applied to the small gate is ground.

6. The method according to claim 1 wherein during a read the difference between the electric potentials of the drain and the source regions is approximately one volt.

7. An EEPROM memory array structure comprising memory cells comprising floating-gate transistors arranged in rows and columns the memory cells having a floating-gate transistor, each floating-gate transistor comprising:
    drain and source regions implanted into a silicon substrate;
    a channel extending between the drain and source regions;
    a tunnel oxide;
    a floating gate;
    a gate oxide; and
    a control gate having a determined gate length, the control gave having a small gate and a large gate arranged side by side and separated by an electrically insulating material; and wherein the floating-gate transistors of a same row have their large gate linked to a first common word line and their small gate linked to a second common word line.

8. The memory array structure according to claim 7 wherein the large gate extends partially over the source region and over a majority of the channel region.

9. The memory array structure according to claim 7 wherein the electrically insulating material is positioned so as to be over the surface between the drain region and the channel region.

10. The memory array structure according to claim 7 wherein the large gate extends completely over the channel region to partially overlay the drain region.

11. The memory array structure according to claim 7 wherein the silicon substrate of a single column of the floating-gate transistors is linked to a common substrate control line.

12. The memory array structure according to claim 7 wherein the source of the floating-gate transistors of a single column is linked to a commmon source line.

13. An EEPROM memory array structure comprising:

a plurality of floating-gate transistors arranged in rows and columns, each floating-gate transistor having:

a silicon substrate region;

a drain region positioned within the substrate region;

a source region positioned within the substrate region;

a channel region extending between the drain and the source regions;

a thin dielectric positioned to overlay the channel region;

a floating gate positioned over the thin dielectric;

an intergate dielectric positioned over the floating gate;

a small gate positioned above the intergate dielectric and to be exclusively over the drain region and a large gate positioned above the intergate dielectric, the small gate and the large gate being arranged side by side and separated from each other by an electrically insulating material;

program latches linked to bit lines that supply a negative and a positive electric potential in a first state; and switches of the same rank interlinked to substrate control lines and the bit lines during the first state and a second state.

* * * * *